(12) United States Patent
Bily et al.

(10) Patent No.: US 6,380,805 B1
(45) Date of Patent: Apr. 30, 2002

(54) OPERATIONAL AMPLIFIER WITH MULTIPLE COMPLEMENTARY P-CHANNEL AND N-CHANNEL INPUT PAIRS TO REDUCE TRANSCONDUCTANCE VARIATION

(75) Inventors: Stephen F. Bily, Austin; Lei Wang, College Station, both of TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/444,015

(22) Filed: Nov. 19, 1999

(51) Int. Cl.[7] ................................................. H03F 3/45
(52) U.S. Cl. ....................... 330/253; 330/257; 330/261
(58) Field of Search ................................. 330/253, 257, 330/261

(56) References Cited

U.S. PATENT DOCUMENTS

| | | | |
|---|---|---|---|
| 6,236,269 B1 * | 5/2001 | Hojabri | 330/253 |
| 6,242,980 B1 * | 6/2001 | Tsukagoshi | 330/253 |
| 6,252,432 B1 * | 6/2001 | Freitas | 330/253 |
| 6,259,280 B1 * | 7/2001 | Koelling | 330/253 |

* cited by examiner

Primary Examiner—Michael B Shingleton
(74) Attorney, Agent, or Firm—James J. Murphy; Winstead Sechrest & Minick

(57) ABSTRACT

In accordance with the present invention complementary P-channel and N-channel input pairs of transistors form in an op amp. Two sets of such pairs are provided so that a transconductance range of each set of pairs is different. By combining the outputs of each of the sets of P-channel and N-channel pairs, a transconductance glitch is reduced in half.

19 Claims, 3 Drawing Sheets

US 6,380,805 B1

OPERATIONAL AMPLIFIER WITH MULTIPLE COMPLEMENTARY P-CHANNEL AND N-CHANNEL INPUT PAIRS TO REDUCE TRANSCONDUCTANCE VARIATION

FIELD OF THE INVENTION

This invention relates to circuit design of operational amplifiers (op amps). More in particularly, it relates to reduction of transconductance variation in op amps which use P-channel and N-channel input pairs.

BACKGROUND OF THE INVENTION

Complementary P-channel and N-channel transistor pairs are used often in order to overcome a dead range in the transconductance response of a P-channel input pair or an N-channel input pair alone. A P-channel transistor pair refers to a pair of P-type transistors and an N-channel transistor pair refers to a pair of N-type transistors. In some applications, it is desired to have a response to input EMF (voltage) of an operational amplifier (op amp) which results in a linear variation of output current over a particular voltage range. In order to accomplish this, P-channel and N-channel input pairs of transistors are used. This overcomes a dead range which would result from a threshold voltage if either a P-channel input pair or an N-channel input pair were used alone.

FIG. 1 shows a typical arrangement, in which a pair of P-channel transistors 13, 14 receive inputs from positive or negative inputs, respectively. A pair of N-channel transistors 17, 18, respectively receive the same inputs. The P-channel and N-channel transistors are able to provide discreet outputs, with the transistors receiving the positive inputs providing negative output signals and the transistors receiving negative input signals providing positive output signals. The use of the combination of P-channel and N-channel pairs responding to the same set of input signals overcomes the dead range which would exist if either a P-channel pair or an N-channel pair were used alone. Thus, in the configuration of FIG. 1, at an upper voltage range, only the N-channel pair 17, 18 functions to provide an output, and at a lower voltage range, only the P-channel pair 13, 14 functions to provide an output. Both pair function at the same time within a middle range. It is desired to make the transconductance value, $G_m$ of the input pair more stable within the input range.

A very common method of doing this is to permit only one input pair of transistors to work at any given time. In order to accomplish this, a current source transistor 21 is used to provide current to the P-channel pair. If it is desired to turn on the P-channel pair, a low impedance transistor is used to cause all current from the current supply transistor to flow to a lower node. This in turn provides current to drive the end pair. A current mirror is used to connect the lower node to ground, so that either the P-channel pair or the N-channel pair have complementary transistors active at any particular time. Thus, if $v_{cm}$ goes low, a control transistor 23 is shut off and the P-channel input pair 17, 18 become active.

In implementing such an arrangement, the operation of the control transistor 23 is not clear cut. Therefore, a transconductance glitch appears at a transition range of the P-channel input pair and the N-channel input pair. The glitch is a significant current amounting to approximately 25% of the normal $G_m$ value as shown in FIG. 2.

SUMMARY OF THE INVENTION

According to the invention, an op amp circuit with complementary pairs of P-channel and N-channel transistors comprising exhibits a reduced transconductance glitch. A first set of complementary P-channel and N-channel transistors receives first and second inputs and is supplied with current through a first power supply and a mirror power supply. At least one additional set of P-channel and N-channel transistors is connected to the first and second inputs and is supplied with current from a second power supply and a second mirror power supply. Control transistors control EMF across the respective sets of P-channel and N-channel transistors and the control transistors interact with the power supplies to establish different transconductance ranges of the sets of P-channel and N-channel transistors. The different transconductance ranges for respective ones of the sets of the P-channel and N-channel transistors causes the op amp to have a reduced transconductance glitch as a result of the different transconductance ranges.

According to a further aspect of the invention, the op amp is configured to provide a predetermined current output, and each set of complementary P-channel and N-channel transistors cooperates in order to provide the predetermined current output. Each set individually provides a proportionally reduced current output, and this permits a reduced current capacity for each of the transistors in said sets. Consequently a correspondingly reducing a layout area is required for fabricating the op amp on an integrated circuit chip. This provides a reduced transconductance glitch as a result of the different transconductance ranges of the respective ones of the sets of the P-channel and N-channel transistors without substantially increasing the layout area.

According to a further aspect of the invention, output fluctuations are reduced during the operation of an op amp which functions with complementary pairs of P-channel and N-channel transistors. First and second sets of complementary P-channel and N-channel transistors are supplied with current through power supply and a mirror power supplies, and are controlled by a first and second control transistors in response to sensed EMF levels. The control transistors each interact with the power supply in order to establish a transconductance range of the P-channel and N-channel transistors at different EMF levels.

According to a further aspect of the invention, different transconductance ranges are used to reduce a transconductance glitch of the op amp by causing the first and second sets of P-channel and N-channel transistors to switch at different times.

According to a further aspect of the invention, an op amp having complementary pairs of P-channel and N-channel transistors is fabricated on an integrated circuit chip, in which output fluctuations during the operation of an op amp are reduced. A determination is made of a desired current output for the op amp to provide and first and second sets of complementary P-channel and N-channel transistors are formed. Respective power supplies and a mirror power supplies are used to control the sets of complementary transistors in response to sensed EMF at different predetermined levels. Sizes of the sets of complementary transistors are determined so that with each set individually provides a proportionally reduced current output, and this permits a corresponding reduction in a layout area for fabricating the op amp.

In the present invention, two sets of complementary P-channel and N-channel pairs of transistors are provided, in which each set is supplied with one half the amount of bias current. In order to control the current going to each set of P-channel and N-channel pairs, a pair of control transistors are used. In one set, the control transistor is a P-type transistor, in which the gate is connected to a supply EMF (voltage). In order that the second set of complimentary pairs have a peak transconductance current at a different voltage, a control transistor for that second set of complementary pairs is provided as an N-type transistor, gated by ground voltage. As a result, the peak in the transconductance current for each of the pairs is reduced at the same time current from the other transconductance pair is provided in a linear fashion. The combined output of the sets of transistors therefore has a much smaller peak in the transconductance range. This peak is nominally half that of what would be accomplished by having a single set of complementary pairs. The use of the P-channel in N-type control transistors also prevents the range of peaks provided by individual transistors from establishing an overlap.

DETAILED DESCRIPTION OF THE PREFERRED EMBODIMENT

Figure 3:
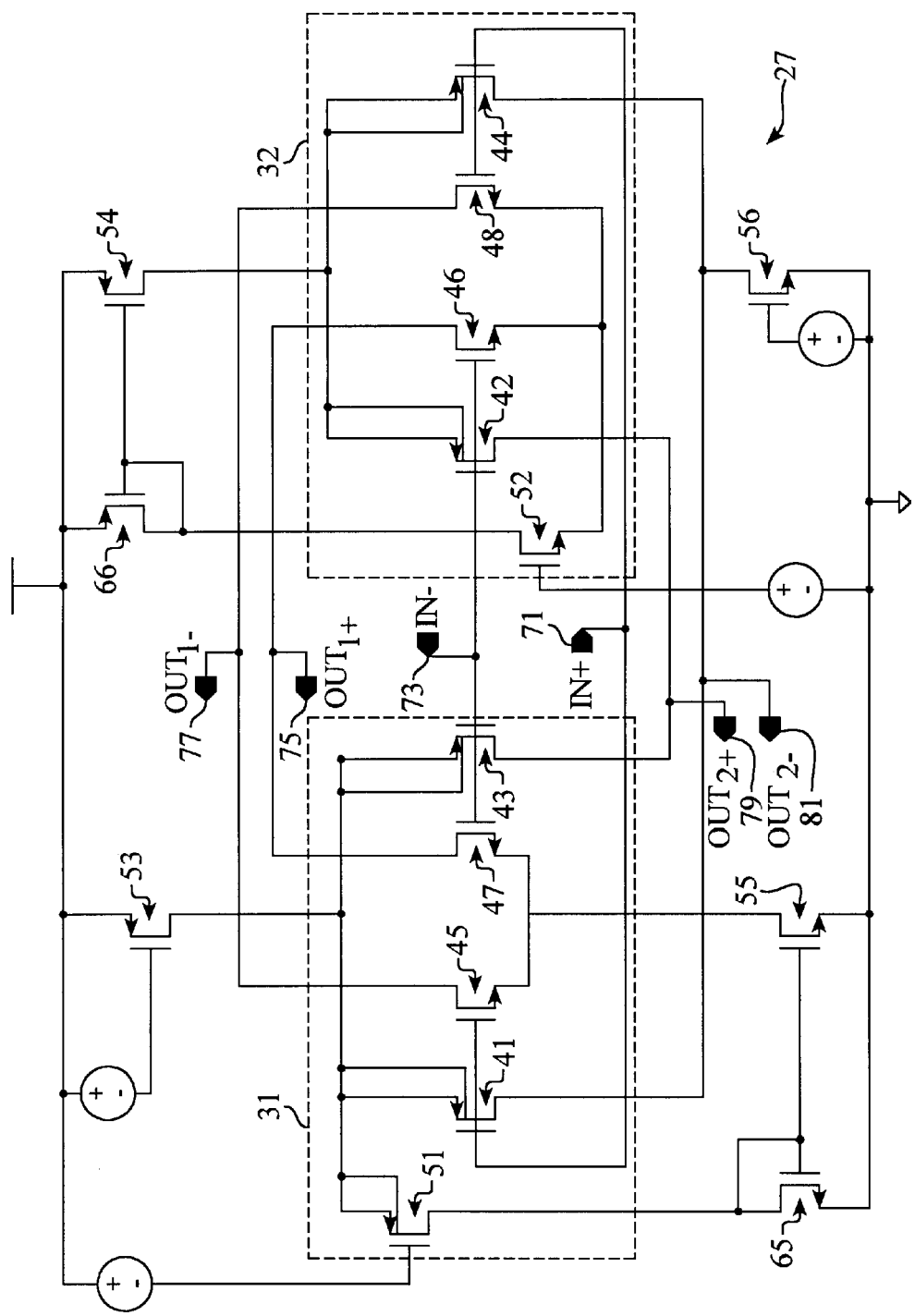
FIG. 3 shows two sets of complementary P-channel and N-channel pairs of transistors configured in accordance with the preferred embodiment of the invention.

Referring to FIG. 3, an operational amplifier 27 using complementary P-channel and N-channel pairs of transistors is shown. In the example shown, two sets 31, 32 of complementary transistor pairs include P-type transistors 41–44 and N-type transistors 45–48. In each set of transistor pairs 31, 32, low impedance control transistors 51, 52 are provided. The transistor pairs receive current from current source transistors 53, 54 and are connected to ground through transistors 55, 56 which function as current mirrors.

Figure 4:
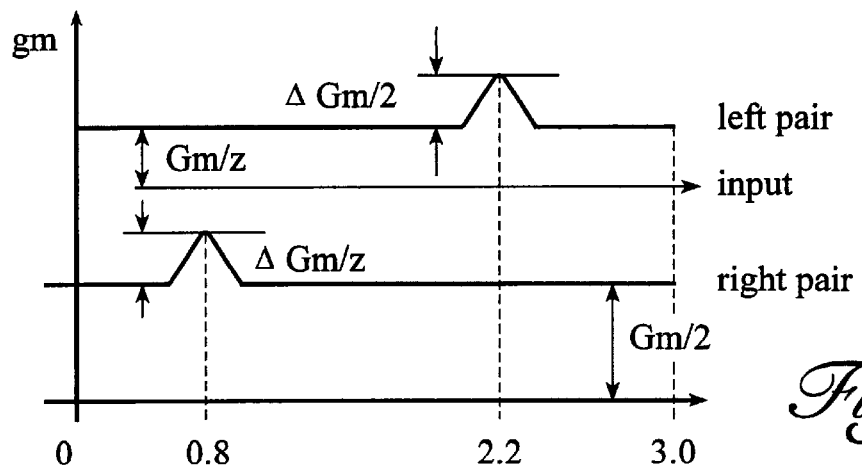
FIG. 4 shows transconductance glitches formed by each set of complementary pairs in the circuit of FIG. 3.

The control transistors 51, 52 function to determine whether the respective P-channel pairs 41 and 43 or 42 and 44 are active or the end pairs 45 and 47, or 46 and 48 are active. This results in a transconductance value, represented by the peaks 61, 62 shown in FIG. 4. In order to establish a desired EMF (voltage) for the transconductance range for each set 31, 32, control transistor 51 conducts through transistor 65 and control transistor 52 conducts through transistor 66. In addition, the control transistors 51, 52 conduct through current supply transistor 53 and current mirror transistor 56, respectively. This arrangement of the connections of control transistors 51 and 52 result in transconductance ranges for the sets of P-channel and N-channel pairs being established at different voltages 61, 62, respectively.

Figure 5:
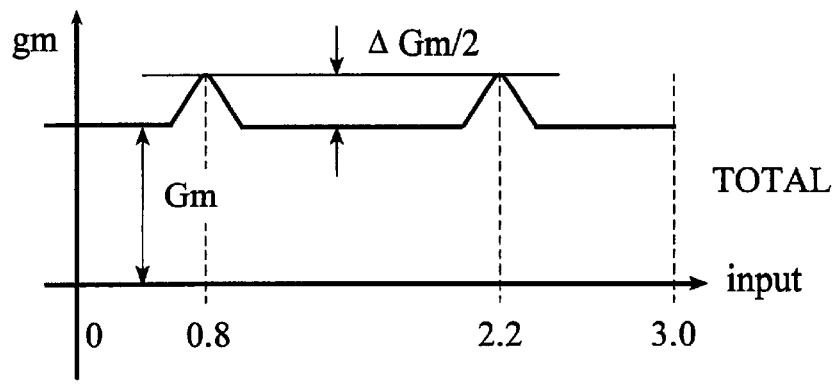
FIG. 5 shows the combined output current total provided by the circuit of FIG. 3.

As shown in FIG. 5 the combination of the different transconductance ranges result in two peaks. Since the total current supplied by both sets of P-channel and N-channel pairs 31, 32 is doubled and the current supplied by any one set of pairs 31 or 32 is half, the peaks 61, 62 are reduced. This results in an op amp output current which is made more stable.

While the number of components to be laid out on an integrated circuit is increased by providing additional P-channel and N-channel transistor pairs, it should also be noted that each pair is required to conduct less current. For this reason, the total real estate used for laying out this circuit on silicon is not substantially increased. In addition, the total number of inputs 71 and 73 and output 75–81 remains the same. Therefore, the number of internal connections or external printouts required for implementing such a circuit is not increased.

All transistor sizes and bias current are reduced in half because it is desired to provide a predetermined total output current. Therefore, the power consumption of the op amp using multiple sets of P-channel and N-channel transistors 31, 32 does not increase, while reducing the transconductance glitch by 50%. This provides an improved rail-to-rail input range op amp with reduced glitches in output current.

Figure 1:
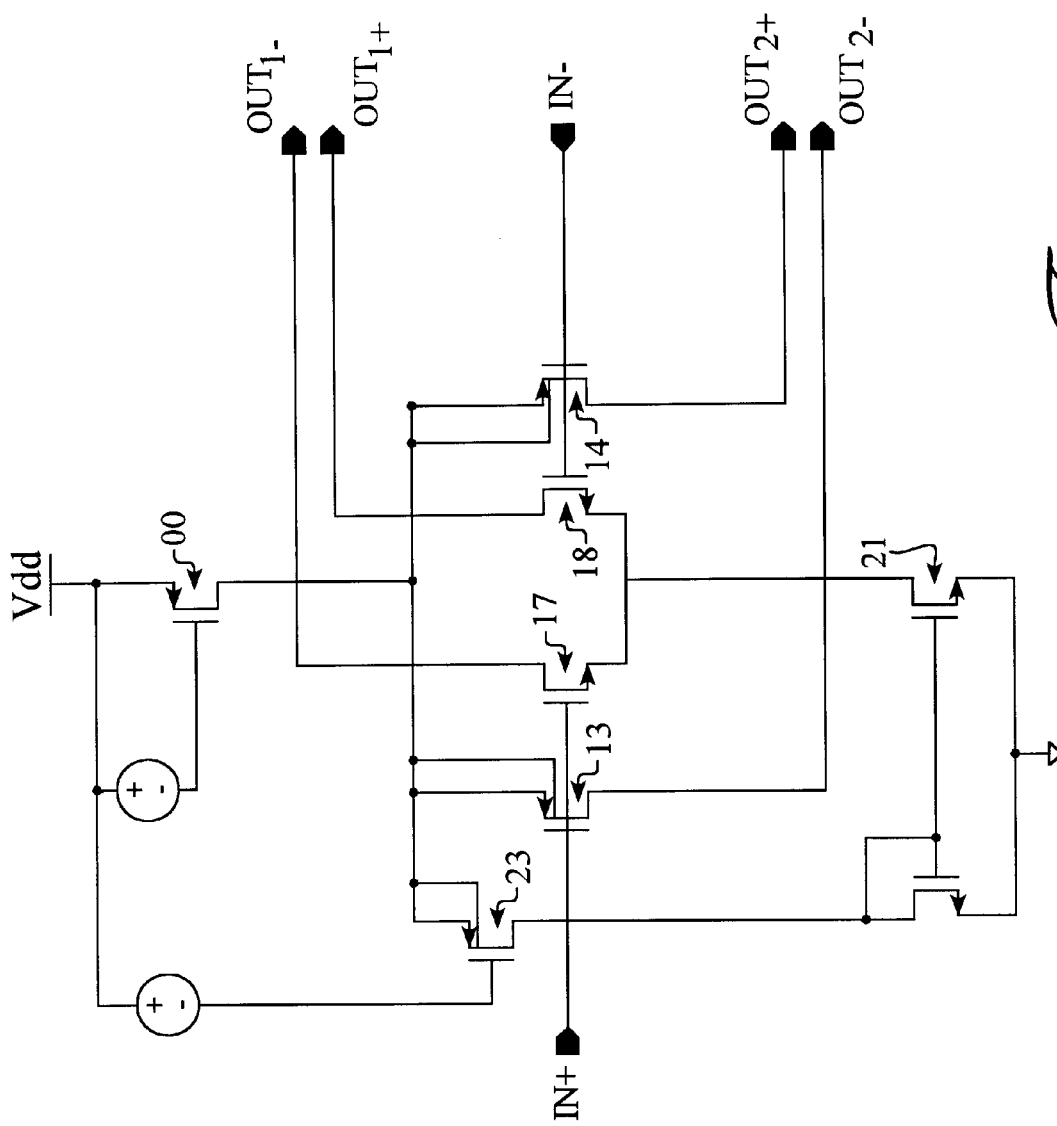
FIG. 1 (prior art) shows combined P-channel and N-channel input pairs used to form an operational amplifier.
Figure 2:
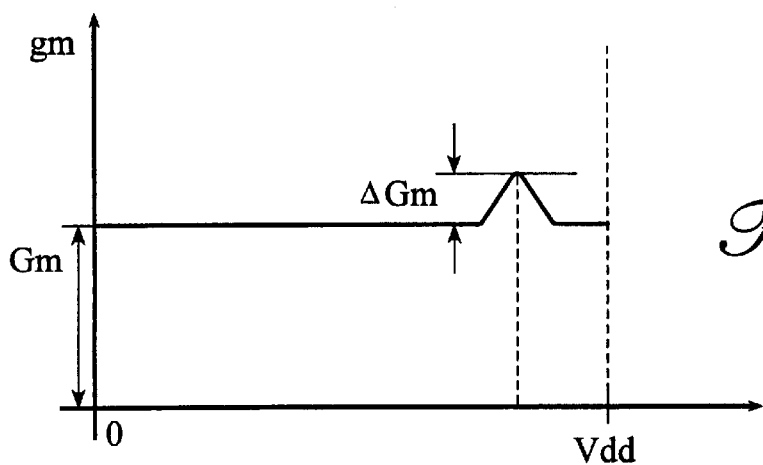
FIG. 2 shows a transconductance value of a set of P-channel and N-channel pairs such as shown in FIG. 1 in terms of total output current verses input voltage.

Since each set 31, 32 of P-channel and N-channel input pairs has half the size and half the tail current as would be required if only a single set of P-channel and N-channel pairs is used in the manner of FIG. 1, each set 31, 32 has a transconductance value $G_m/2$ both sets 31, 32 have the same general structure with respect to the P-channel and N-channel transistors 41 and 48. The difference between the two sets 31, 32 is in the tail current switching ranges, or the transition between the conductance of the P-channel pairs 41, 43 or 42, 44 and the N-channel pairs 45, 47 or 46, 48. As a result of the similar structure, both sets work in a complementary manner.

In the example, if the supply voltage $v_{gd}$ is 3.0 volts, this establishes a transconductance voltage. When $v_{cm}$ goes to 2.2 volts, the P-channel input pair 41, 43 in set 31 are shut off and the N-channel input pair 45, 47 are turned on. There is a transconductance glitch in that set 31. The value of the transconductance glitch is defined as $\Delta G_m/2$, since the normal conductance value in this set 31 is only $G_m/2$. At the same time, the P-channel and N-channel input pair is stable and no tail current switching occurs.

When the $v_{cm}$ goes to 0.8 volts, the N-channel input pair 42, 44 in the second set 32 are shut off in the P-channel input pair 46, 48 and that set is turned on. This also results in a transconductance glitch of $\Delta G_m/2$, at this point.

Therefore, the normal transconductance of the entire op amp 27 is $2\times(G_m/2)=G_m$. The two transconductance glitches of each set 31, 32 will not be additives since the transconductance glitches occur at different levels at $v_{cm}$. Therefore, the transconductance glitch remains at $\Delta G_m/2$, as shown in FIG. 5.

It should be understood that various modifications within the scope of this invention can be made by one of ordinary skill in the art without departing from the spirit thereof. We therefore wish our invention to be defined by the scope of the appended claims as broadly as the prior art will permit, and in view of the specification if need be.

What is claimed is:

1. An op amp circuit which functions with complementary pairs of P-channel and N-channel transistors comprising:

a first set of complementary P-channel and N-channel transistors, in which a first input is supplied to a first P-channel and first N-channel transistor and a second input is provided to a second P-channel and a second N-channel transistor;

the first set of P-channel and N-channel transistors supplied with current through a first power supply and a mirror power supply;

a first control transistor controlling EMF across the first set of complementary P-channel and N-channel transistors;

at least one additional set of P-channel and N-channel transistors, the additional set connected to said first and second input;

the additional set of P-channel and N-channel transistors supplied with current with a second power supply and a second mirror power supply;

a second control transistor controlling EMF across the additional set of P-channel and N-channel transistors; and each of said control transistors interacting with said power supply to establish a transconductance range of said P-channel and N-channel transistors.

2. The circuit of claim 1 wherein one of said control transistors receives at least a portion of its supply current from said current supply and the other one of said control transistors receives at least a portion of its supply current through one of said mirror power supplies.

3. The circuit of claim 2 comprising:

the first and second control transistors establishing different transconductance ranges for respective ones of the sets of the P-channel and N-channel transistors, thereby causing the op amp to have a reduced transconductance glitch as a result of the different transconductance ranges of the respective ones of the sets of the P-channel and N-channel transistors.

4. The circuit of claim 1 comprising:

the first and second control transistors establishing different transconductance ranges for respective ones of the sets of the P-channel and N-channel transistors, thereby causing the op amp to have a reduced transconductance glitch as a result of the different transconductance ranges of the respective ones of the sets of the P-channel and N-channel transistors.

5. The circuit of claim 1 wherein:

the op amp is configured to provide a predetermined current output, and each of said sets of complementary P-channel and N-channel transistors cooperates in order to provide said predetermined current output, with each of said sets individually providing a proportionally reduced current output, thereby permitting a reduced current capacity for each of the transistors in said sets; and said reduced current capacity for each of the transistors correspondingly reducing a layout area for fabricating said op amp on an integrated circuit chip, thereby providing a reduced transconductance glitch as a result of the different transconductance ranges of the respective ones of the sets of the P-channel and N-channel transistors without substantially increasing the layout area.

6. An op amp circuit which functions with complementary pairs of P-channel and N-channel transistors comprising:

a first set of complementary P-channel and N-channel transistors, in which a first input is supplied to a first P-channel and first N-channel transistor and a second input is provided to a second P-channel and a second N-channel transistor;

the first set of P-channel and N-channel transistors supplied with current through a first power supply and through a first mirror power supply;

a first control transistor controlling EMF across the first set of complementary P-channel and N-channel transistors;

at least one additional set of P-channel and N-channel transistors, the additional set connected to said first and second input;

the additional set of P-channel and N-channel transistors supplied with current with a second power supply and receiving at least a portion of its supply current through a second mirror power supply;

a second control transistor controlling EMF across the additional set of P-channel and N-channel transistors; and each of said control transistors interacting with said power supply to establish a transconductance range of said P-channel and N-channel transistors, and the first and second control transistors establishing different transconductance ranges for respective ones of the sets of the P-channel and N-channel transistors.

7. The circuit of claim 6 wherein:

the op amp is configured to provide a predetermined current output, and each of said sets of complementary P-channel and N-channel transistors cooperates in order to provide said predetermined current output, with each of said sets individually providing a proportionally reduced current output, thereby permitting a reduced current capacity for each of the transistors in said sets; and said reduced current capacity for each of the transistors correspondingly reducing a layout area for fabricating said op amp on an integrated circuit chip, thereby providing a reduced transconductance glitch as a result of the different transconductance ranges of the respective ones of the sets of the P-channel and N-channel transistors without substantially increasing the layout area.

8. An circuit in which complementary pairs of P-channel and N-channel transistors provide an amplifier response, the circuit comprising:

at least two sets of complementary P-channel and N-channel transistors, in which each set has a first input and a second input;

the first input in each set supplied to a first P-channel and first N-channel transistor in that set and the second input in each set provided to a second P-channel and a second N-channel transistor in that set;

at least one of said sets supplied with current through a first power supply and a mirror power supply;

at least one of said sets supplied with current through a second power supply; and the supply of current through the first and second power supplies and the mirror power supply establishing separate transconductance range of said P-channel and N-channel transistors in at least two of said sets.

9. The circuit of claim 8 comprising:

at least one of the first and second power supplies including a control transistor;

said control transistor interacting with its power supply to establish a transconductance range of transistors which are supplied with current through said power supply.

10. The circuit of claim 8 further comprising:

a first control transistor controlling EMF across the first set of complementary P-channel and N-channel transistors; and a second control transistor controlling EMF across the additional set of P-channel and N-channel transistors.

11. The circuit of claim 10 wherein one of said control transistors receives at least a portion of its supply current from said current supply and the other one of said control transistors receives at least a portion of its supply current through one of said mirror power supplies.

12. The circuit of claim 10 comprising:

the first and second control transistors establishing different transconductance ranges for respective ones of the sets of the P-channel and N-channel transistors, thereby causing the op amp to have a reduced transconductance glitch as a result of the different transconductance ranges of the respective ones of the sets of the P-channel and N-channel transistors.

13. The circuit of claim 8 wherein:

the op amp is configured to provide a predetermined current output, and each of said sets of complementary P-channel and N-channel transistors cooperates in order to provide said predetermined current output, with each of said sets individually providing a proportionally reduced current output, thereby permitting a reduced current capacity for each of the transistors in said sets; and said reduced current capacity for each of the transistors correspondingly reducing a layout area for fabricating said op amp on an integrated circuit chip, thereby providing a reduced transconductance glitch as a result of the different transconductance ranges of the respective ones of the sets of the P-channel and N-channel transistors without substantially increasing the layout area.

14. Method of reducing output fluctuations during the operation of an op amp which functions with complementary pairs of P-channel and N-channel transistors, the method comprising:

providing a first set of complementary P-channel and N-channel transistors, supplied with current through a power supply and a mirror power supply, and controlled by a first control transistor controlling the first set of complementary P-channel and N-channel transistors in response to sensed EMF at a first predetermined level;

providing a second set of complementary P-channel and N-channel transistors, supplied with current through a power supply and a mirror power supply, and controlled by a second control transistor controlling the second set of complementary P-channel and N-channel transistors in response to sensed EMF at a second predetermined level; and the control transistors each interacting with said power supply to establish a transconductance range of said P-channel and N-channel transistors at different ranges corresponding to said first and second sensed EMF levels.

15. The method of claim 14 comprising providing one of said control transistors at least a portion of its supply current from said current supply and providing the other one of said control transistors receives at least a portion of its supply current through one of said mirror power supplies.

16. The method of claim 14 comprising:

using the first and second control transistors to establish different transconductance ranges for respective ones of the sets of the P-channel and N-channel transistors;

using the different transconductance ranges to reduce a transconductance glitch of the op amp by causing the first and second sets of P-channel and N-channel transistors to switch at different times.

17. Method of fabricating an op amp of the type having complementary of P-channel and N-channel transistors on an integrated circuit chip, in which output fluctuations during the operation of an op amp are reduced, the method comprising:

determining a desired current output for the op amp to provide;

forming chip first and second sets of complementary P-channel and N-channel transistors;

forming a first power supply and a second mirror power supply, controlled by a first control transistor controlling the first set of complementary P-channel and N-channel transistors in response to sensed EMF at a first predetermined level;

forming a second power supply and a second mirror power supply, controlled by a second control transistor controlling the second set of complementary P-channel and N-channel transistors in response to sensed EMF at a second predetermined level;

configuring the control transistors to interacting with said power supplies to establish a transconductance range of said P-channel and N-channel transistors at different ranges corresponding to said first and second sensed EMF levels; and determining sizes of the transistors in the first and second sets of complementary P-channel and N-channel transistors so that each of said sets of complementary P-channel and N-channel transistors cooperates in order to provide said predetermined current output, with each of said sets individually providing a proportionally reduced current output, thereby permitting a reduced current capacity for each of the transistors in said sets.

18. The method of claim 17 further comprising reducing a layout area for fabricating said op amp on an integrated circuit chip as a result of providing said reduced current capacity for each of the transistors, thereby providing a reduced transconductance glitch as a result of the different transconductance ranges of the respective ones of the sets of the P-channel and N-channel transistors without substantially increasing the layout area.

19. The method of claim 17 further comprising determining a desired current output for the op amp;

determining a size for each of said sets of complementary P-channel and N-channel transistors in order to provide a predetermined share of said desired current output, thereby permitting a reduced current capacity for each of the transistors in said sets; and said reduced current capacity for each of the transistors correspondingly reducing a layout area for fabricating said op amp on an integrated circuit chip, thereby providing a reduced transconductance glitch as a result of the different transconductance ranges of the respective ones of the sets of the P-channel and N-channel transistors without substantially increasing the layout area.

* * * * *